United States Patent
Zhu

(10) Patent No.: US 11,309,894 B2
(45) Date of Patent: Apr. 19, 2022

(54) METHOD AND SYSTEM PROVIDING FPGA DEVICE IDENTIFICATION VIA A SET OF EMBEDDED SIGNATURE REGISTERS

(71) Applicant: GOWIN Semiconductor Corporation, GuangZhou (CN)

(72) Inventor: Jinghui Zhu, San Jose, CA (US)

(73) Assignee: GOWIN SEMICONDUCTOR CORPORATION, Guangzhou (CN)

(*) Notice: Subject to any disclaimer, the term of this patent is extended or adjusted under 35 U.S.C. 154(b) by 0 days.

(21) Appl. No.: 16/836,899

(22) Filed: Mar. 31, 2020

(65) Prior Publication Data

US 2021/0305986 A1    Sep. 30, 2021

(51) Int. Cl.
*H03K 19/17728* (2020.01)
*H03K 19/173* (2006.01)

(52) U.S. Cl.
CPC ... *H03K 19/17728* (2013.01); *H03K 19/1735* (2013.01); *H03K 19/1737* (2013.01)

(58) Field of Classification Search
CPC ......... H03K 19/17728; H03K 19/1735; H03K 19/1737; G11C 29/26; G11C 29/38
See application file for complete search history.

(56) References Cited

U.S. PATENT DOCUMENTS

| 5,867,725 A | * | 2/1999 | Fung | G06F 9/462 |
| | | | | 712/23 |
| 8,415,974 B1 | * | 4/2013 | Lysaght | H03K 19/17752 |
| | | | | 326/39 |

* cited by examiner

*Primary Examiner* — Daniel D Chang
(74) *Attorney, Agent, or Firm* — JW Law Group; James M. Wu

(57) ABSTRACT

A programmable integrated circuit ("PIC") device includes configurable logic blocks ("LBs"), routing connections, and configuration memory for performing user defined programmed logic functions. Each configurable LB, in one example, includes a set of lookup tables ("LUTs") and associated registers. The LUTs, for example, are configured to generate one or more output signals in accordance with a set of input signals. The registers are arranged so that each register corresponds to one LUT. In one embodiment, a group of registers, instead of assigning to a group of LUTs across multiple configurable LBs, is allocated or configured as embedded signature registers in PSD. For example, a first register which corresponds or physically situated in the vicinity of first LUT can be designated as an embedded signature register for storing a fixed value or signature information for facilitating device or IC identification.

19 Claims, 12 Drawing Sheets

METHOD AND SYSTEM PROVIDING FPGA DEVICE IDENTIFICATION VIA A SET OF EMBEDDED SIGNATURE REGISTERS

FIELD

The exemplary embodiment(s) of the present invention relates to the field of programmable semiconductor devices for computer hardware and software. More specifically, the exemplary embodiment(s) of the present invention relates to identifying authenticity of a field-programmable gate array ("FPGA") or programmable logic device ("PLD").

BACKGROUND

With increasing popularity of digital communication, artificial intelligence (AI), IoT (Internet of Things), and/or robotic controls, the demand for faster and efficient hardware and semiconductors with processing capabilities is constantly in demand. To meet such demand, high-speed and flexible semiconductor chips are generally more desirable. Once conventional approach to satisfy such demand is to use dedicated custom integrated circuits and/or application-specific integrated circuits ("ASICs") to fulfil such needs. A shortcoming with ASIC approach is that it lacks flexibility while consumes a large amount of resources.

An alternative conventional approach, which enjoys the growing popularity, is utilizing programmable semiconductor devices ("PSDs") such as programmable logic devices ("PLDs") or field programmable gate arrays ("FPGAs"). A feature of PSD is that it allows an end user to program one or more desirable functions to suit his/her applications after the PSD is fabricated.

A drawback, however, associated with a conventional FPGA or PLD is that it is difficult to verify authenticity of the device, such as FPGA or PLD, after such devices are in the field or at the user (or customer) sites.

SUMMARY

One embodiment of the present invention discloses a programmable semiconductor device ("PSD") or programmable integrated circuit ("PIC") device including configurable logic blocks ("LBs"), routing connections, and configuration memory for performing user defined programmed logic functions. Each configurable LB, in one example, includes a set of lookup tables ("LUTs") and associated registers. The LUTs, for example, are configured to generate one or more output signals in accordance with a set of input signals. The registers are arranged so that each register corresponds to one LUT. In one embodiment, a group of registers, instead of assigning to a group of LUTs across multiple configurable LBs, is allocated or configured as embedded signature registers in PSD. For example, a first register which corresponds or physically situated in the vicinity of first LUT can be designated as an embedded signature register for storing a fixed value or signature information for facilitating device or IC identification. A second register which corresponds to a second LUT is configured to store a second output signal of the second LUT.

Additional features and benefits of the exemplary embodiment(s) of the present invention will become apparent from the detailed description, figures and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1A:
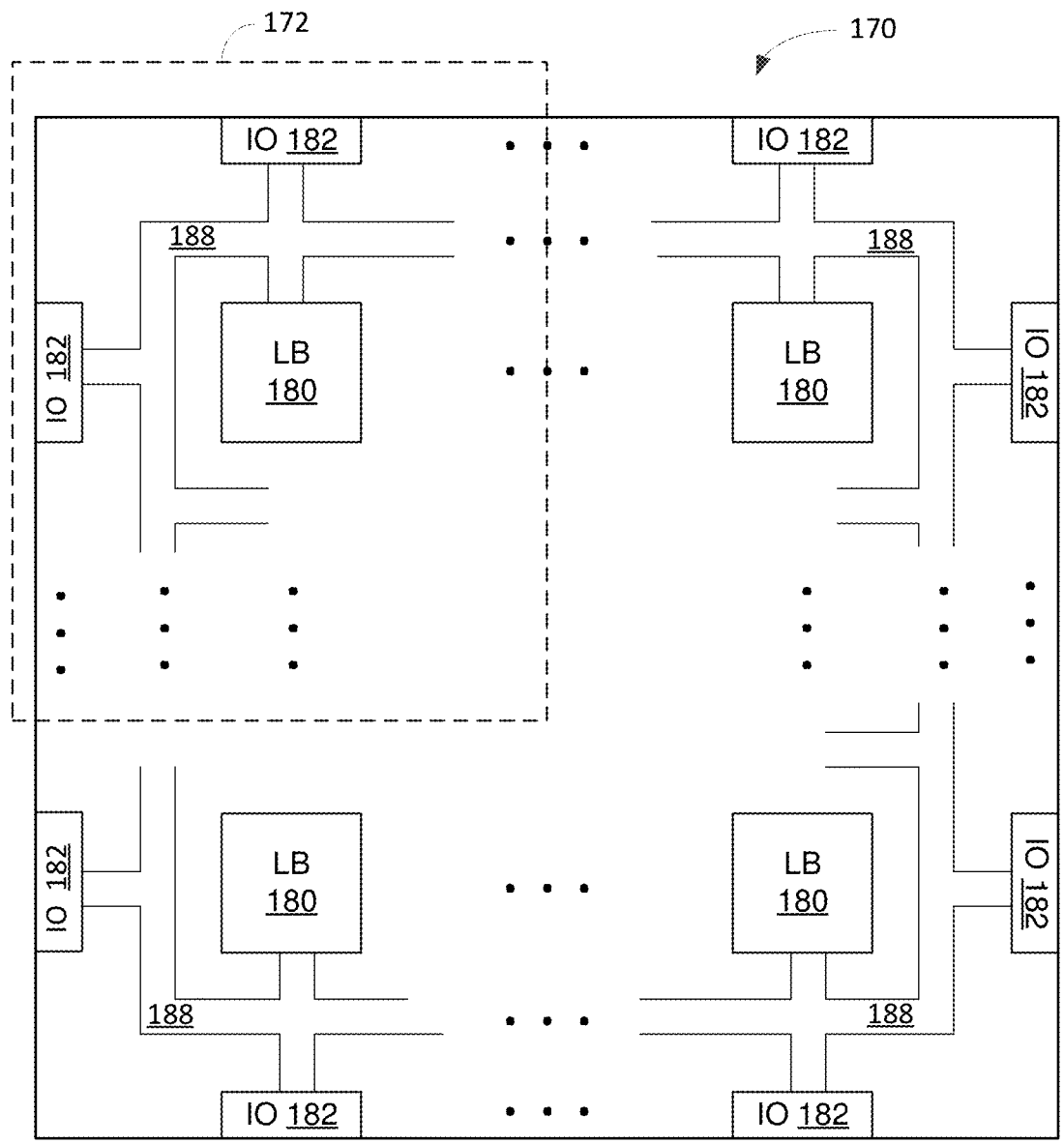
FIGS. 1A-1B are block diagrams illustrating a programmable semiconductor device ("PSD") or programmable integrated circuit ("PIC") containing signature registers for identifying device identity ("ID") in accordance with one embodiment of the present invention.

Embodiments of the present invention disclose a method(s) and/or apparatus for providing a programmable semiconductor device ("PSD") capable of identifying device ID using a set of signature registers.

The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or description.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application- and business-related constraints, and that these specific goals will vary from one implementation to another and from one developer to another. Moreover, it will be understood that such a development effort might be complex and time-consuming but would nevertheless be a routine undertaking of engineering for those of ordinary skills in the art having the benefit of embodiment(s) of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

In accordance with the embodiment(s) of present invention, the components, process steps, and/or data structures described herein may be implemented using various types of operating systems, computing platforms, computer programs, and/or general-purpose machines. In addition, those of ordinary skills in the art will recognize that devices of a less general-purpose nature, such as hardware devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device, such as, but not limited to, magnetoresistive random access memory ("MRAM"), phase-change memory, or ferroelectric RAM ("FeRAM"), flash memory, ROM (Read Only Memory), PROM (Programmable Read Only Memory), EEPROM (Electrically Erasable Programmable Read Only Memory), Jump Drive, magnetic storage medium (e.g., tape, magnetic disk drive, and the like), optical storage medium (e.g., CD-ROM, DVD-ROM, paper card and paper tape, and the like) and other known types of program memory.

The term "system" or "device" is used generically herein to describe any number of components, elements, subsystems, devices, packet switch elements, packet switches, access switches, routers, networks, computer and/or communication devices or mechanisms, or combinations of components thereof. The term "computer" includes a processor, memory, and buses capable of executing instruction wherein the computer refers to one or a cluster of computers, personal computers, workstations, mainframes, or combinations of computers thereof.

One embodiment of the present disclosed invention illustrates a PSD, PIC device, FPGA, or PLD having configurable LBs, routing connections, and/or configuration memory for performing user defined programmed logic functions. Each configurable LB, in one example, includes a set of LUTs and associated registers. Each LUT, for example, is configured to generate one or more output signals in accordance with a set of input signals. The registers are arranged so that each register corresponds to one LUT. In one embodiment, a group of registers, instead of assigning to a group of LUTs across multiple configurable LBs, is allocated or configured as embedded signature registers in PSD. For example, a first register which corresponds or physically situated in the vicinity of first LUT can be designated as an embedded signature register for storing a fixed value or signature information for facilitating device or IC identification. A second register which corresponds to a second LUT is configured to store a second output signal of the second LUT.

FIG. 1A is a block diagram illustrating PSD containing signature registers for facilitating device identification ("ID") in accordance with one embodiment of the present invention. PSD, also known as FPGA or a type of Programmable Logic Device ("PLD"), includes a device identifier capable of authenticating PSD using a set of embedded signature registers. For example, the device identifier is able to verify authenticity of an FPGA via implementation of bitstream(s). It should be noted that the underlying concept of the exemplary embodiment(s) of the present invention would not change if one or more blocks (circuit or elements) were added to or removed from diagram 170.

PSD includes an array of configurable LBs 180 surrounded by input/output blocks ("IOs") 182, and programmable interconnect resources 188 ("PIR") that include vertical interconnections and horizontal interconnections extending between the rows and columns of LB 180 and IO 182. PIR 188 may further include interconnect array decoders ("IAD") or programmable interconnection array ("PIA"). It should be noted that the terms PIR, IAD, and PIA may be used interchangeably hereinafter.

Each LB, in one example, includes programmable combinational circuitry and selectable output registers programmed to implement at least a portion of a user's logic function. The programmable interconnections, connections, or channels of interconnect resources are configured using various switches to generate signal paths between the LBs 180 for performing logic functions. Each IO 182 is programmable to selectively use an I/O pin (not shown) of PSD.

PSD, in one embodiment, can be divided into multiple programmable partitioned regions ("PPRs") 172 wherein each PPR 172 includes a portion of LBs 180, some PIR 188, and IOs 182. A benefit of organizing PSD into multiple PPRs 172 is to optimize management of storage capacity, power supply, and/or network transmission.

Bitstream is a binary sequence (or a file) containing programming information for an FPGA or PLD. The bitstream is created to reflect user's logic functions together with certain controlling information. For an FPGA or PLD to function properly, at least a portion of the registers or flipflops in the FPGA needs to be programmed or configured before it can function. It should be noted that bitstream is used as input configuration data to an FPGA while a readback bitstream is a readback binary sequence for verifying current configuration status of an FPGA in use. The readback bitstream is a binary sequence which is generated by retrieving bit values from at least a portion of FPGA registers currently in use.

A benefit of using a readback bitstream is to verify an FPGA in use as well as backing up the configuration information for emergency restoration.

Figure 1B:
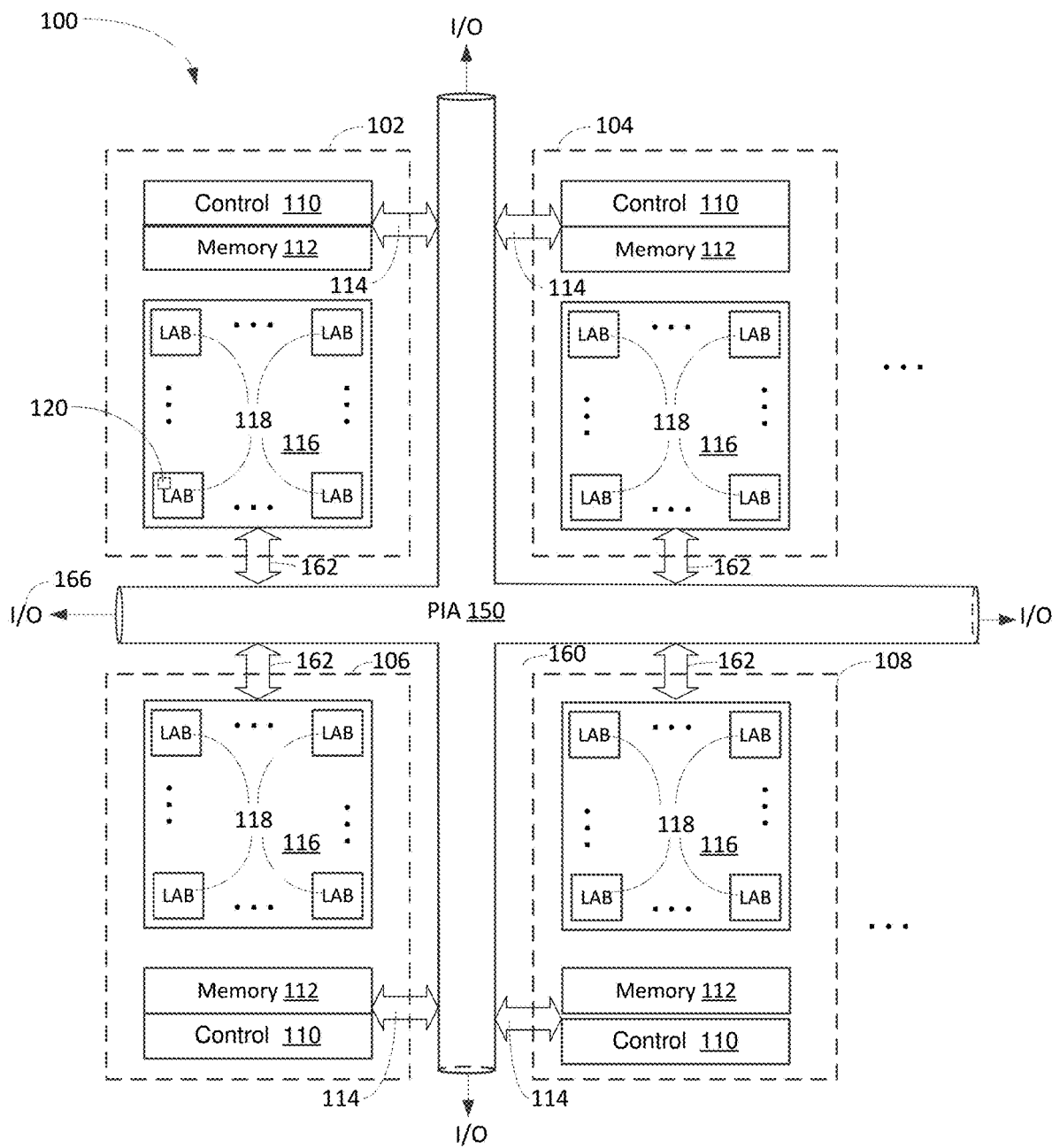

FIG. 1B is a block diagram illustrating a PSD or PIC containing embedded signature registers for identifying device ID in accordance with one embodiment of the present invention. To simplify forgoing discussion, the terms "PSD", "PIC", FPGA, and PLD are referring the same or similar devices and they can be used interchangeably hereinafter. Diagram 100 includes multiple PPRs 102-108, PIA 150, and regional I/O ports 166. PPRs 102-108 further includes control units 110, memory 112 and LBs 116. Note that control units 110 can be configured into one single control unit, and similarly, memory 112 can also be configured into one single memory for storing configurations. It should be noted that the underlying concept of the exemplary embodiment(s) of the present invention would not change if one or more blocks (circuit or elements) were added to or removed from diagram 100.

LBs 116, also known as configurable function unit ("CFU") include multiple LABs 118 which is also known as configurable logic unit ("CLU"). Each LAB 118, for example, can be further organized to include, among other circuits, a set of programmable logical elements ("LEs"), configurable logic slices ("CLS"), or macrocells, not shown in FIG. 1B. Each LAB, in one example, may include anywhere from 32 to 512 programmable LEs. I/O pins (not shown in FIG. 1B), LABs, and LEs are linked by PIA 150 and/or other buses, such as buses 162 or 114, for facilitating communication between PIA 150 and PPRs 102-108.

Each LE includes programmable circuits such as the product-term matrix, lookup tables, and/or registers. LE is also known as a cell, configurable logic block ("CLB"), slice, CFU, macrocell, and the like. Each LE can be independently configured to perform sequential and/or combinatorial logic operation(s). It should be noted that the underlying concept of PSD would not change if one or more blocks and/or circuits were added or removed from PSD.

Control units 110, also known as configuration logics, can be a single control unit. Control unit 110, for instance, manages and/or configures individual LE in LAB 118 based on the configuring information stored in memory 112. It should be noted that some I/O ports or I/O pins are configurable so that they can be configured as input pins and/or output pins. Some I/O pins are programmed as bi-directional I/O pins while other I/O pins are programmed as unidirectional I/O pins. The control units such as unit 110 is used to handle and/or manage PSD operations in accordance with system clock signals.

LBs 116 include multiple LABs which can be programed by the end user(s). Each LAB contains multiple LEs wherein each LE further includes one or more lookup tables ("LUTs") as well as one or more registers (or D flip-flops or latches). Depending on the applications, LEs can be configured to perform user specific functions based on a predefined functional library facilitated by configuration software. PSD, in some applications, also includes a set fixed circuits for performing specific functions. For example, the fixed circuits include, but not limited to, processor(s), DSP (digital signal processing) unit(s), wireless transceiver(s), and so forth.

PIA 150 is coupled to LBs 116 via various internal buses such as buses 114 or 162. In some embodiments, buses 114 or 162 are part of PIA 150. Each bus includes channels or wires for transmitting signals. It should be noted that the terms channel, routing channel, wire, bus, connection, and interconnection are referred to the same or similar connections and will be used interchangeably herein. PIA 150 can also be used to receives and/or transmits data directly or indirectly from/to other devices via I/O pins and LABs.

Memory 112 may include multiple storage units situated across a PPR. Alternatively, memories 112 can be combined into one single memory unit in PSD. In one embodiment, memory 112 is an NVM storage unit used for both configuration as well as user memory. NVM storage unit can be, but not limited to, MRAM, flash, Ferroelectric RAM, and/or phase changing memory (or chalcogenide RAM). To simplify forgoing discussion, MRAM is used as an exemplary NVM throughout the remaining of the discussion. Depending on the applications, a portion of the memory 112 can be designated, allocated, or configured to be a block RAM ("BRAM") used for storing large amounts of data in PSD.

A PSD includes a number of programmable LBs 116 that are interconnected by PIA 150, wherein each programmable LB is further divided into multiple LABs 118. Each LAB 118 further includes a number of LUTs, multiplexers and/or registers. During configuration, a user programs a truth table for each LUT to implement a desired logical function. It should be noted that each LAB, which can be further organized to include multiple logic elements ("LEs"), can be considered as a configurable logic cell ("CLC") or slice. For example, a four-input (16 bit) LUT receives LUT inputs from a routing structure (not shown in FIG. 1B). Based upon the truth table programmed into LUT during configuration of PSD, a combinatorial output is generated via a programmed truth table of LUT in accordance with the logic values of LUT inputs. The combinatorial output is subsequently latched or buffered in a register or flip-flop before the clock cycle ends.

In one embodiment, a set of signature registers is embedded and/or scattered across multiple LEs. For example, a configured LE may be configured one or more registers dedicated to signature registers 120. A function of device ID is to allow a user or application to determine the identity of the FPGA in use via the set of signature registers 120. For example, a user can use device ID to determine whether a counterfeit device has been detected.

Accordingly, a benefit of using the device ID is to enhance overall device liability and integrity by removing low quality counterfeit devices.

Figure 2:
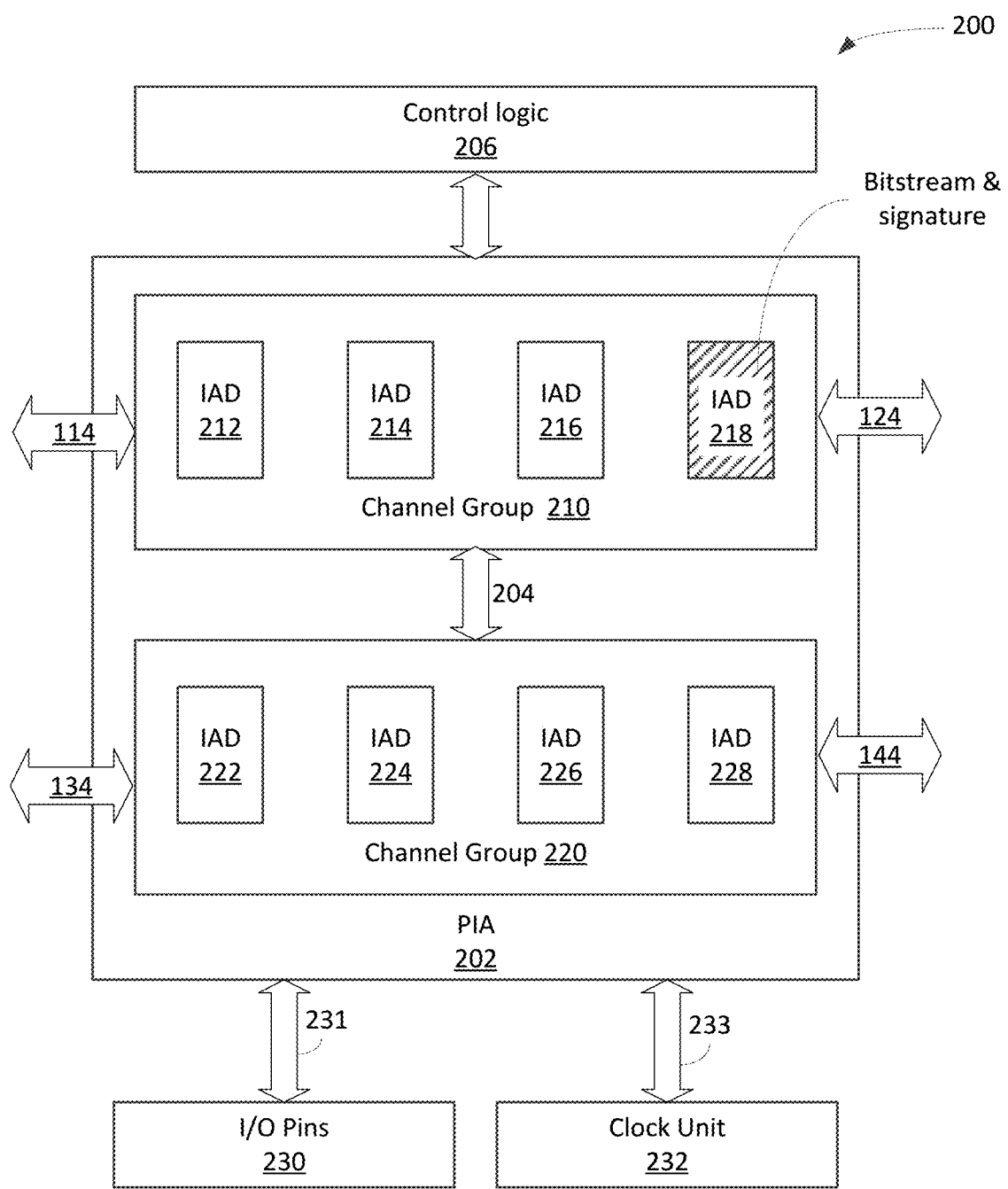
FIG. 2 is a block diagram illustrating a routing logic or routing fabric containing programmable interconnection arrays including signature information routings in accordance with one embodiment of the present invention.

FIG. 2 is a block diagram 200 illustrating a routing logic or routing fabric containing programmable interconnection arrays including routing signature information in accordance with one embodiment of the present invention. Diagram 200 includes control logic 206, PIA 202, I/O pins 230, and clock unit 232. Control logic 206, which may be similar to control units shown in FIG. 1B, provides various control functions including channel assignment, differential I/O standards, and clock management. Control logic 206 may contain volatile memory, non-volatile memory, and/or a combination of volatile and nonvolatile memory device for storing information such as configuration data. In one embodiment, control logic 206 is incorporated into PIA 202. It should be noted that the underlying concept of the exemplary embodiment(s) of the present invention would not change if one or more blocks (circuit or elements) were added to or removed from diagram 200.

I/O pins 230, connected to PIA 202 via a bus 231, contain multiple programmable I/O pins configured to receive and/or transmit signals to external devices. Each programmable I/O pin, for instance, can be configured to input, output, and/or bi-directional pin. Depending on the applications, I/O pins 230 may be incorporated into control logic 206.

Clock unit 232, in one example, connected to PIA 202 via a bus 233, receives various clock signals from other components, such as a clock tree circuit or a global clock oscillator. Clock unit 232, in one instance, generates clock signals in response to system clocks as well as reference clocks for implementing I/O communications. Depending on the applications, clock unit 232, for example, provides clock signals to PIA 202 including reference clock(s).

PIA 202, in one aspect, is organized into an array scheme including channel groups 210 and 220, bus 204, and I/O buses 114, 124, 134, 144. Channel groups 210, 220 are used to facilitate routing information between LBs based on PIA configurations. Channel groups can also communicate with each other via internal buses or connections such as bus 204. Channel group 210 further includes interconnect array decoders ("IADs") 212-218. Channel group 220 includes four IADs 222-228. A function of IAD is to provide a configurable routing resources for data transmission.

IAD such as IAD 212 includes routing multiplexers or selectors for routing signals between I/O pins, feedback outputs, and/or LAB inputs to reach their destinations. For example, an IAD can include up to 36 multiplexers which can be laid out in four banks wherein each bank contains nine rows of multiplexers. It should be noted that the number of IADs within each channel group is a function of the number of LEs within the LAB.

PIA 202, in one embodiment, designates a special IAD such as IAD 218 for facilitating signature information routing. For example, IAD 218 is designated to handle connections and/or routings signature information during bitstream transmission. It should be noted that additional IADs may be allocated for handling device ID.

An advantage of using IAD 218 within PIA as a designated signature routing is to facilitate signature information for device ID in PSD or FPGA.

Figure 3A:
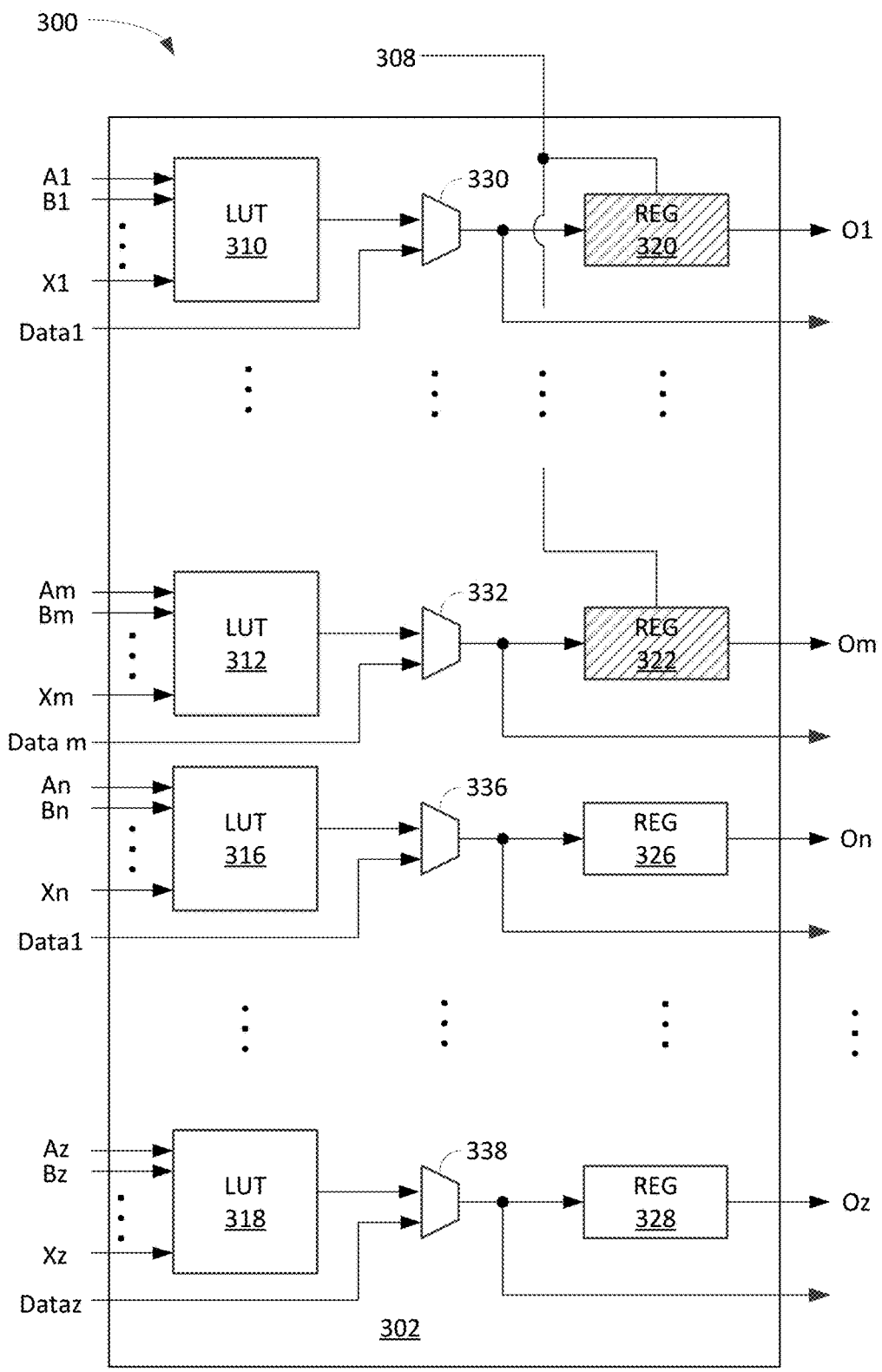
FIGS. 3A-3B are block diagrams illustrating a configurable logic element ("LE") in PSD containing signature registers in accordance with one embodiment of the present invention.

FIG. 3A is a block diagram 300 illustrating a configurable LE or CLS 302 in PSD containing embedded signature registers in accordance with one embodiment of the present invention. Diagram 300 includes multiple LUTs 310-318, multiplexers ("Muxes") 330-338, embedded signature registers 320-322, and registers 326-328. Muxes 330-338, in one example, are used to select intermediary outputs in response to LUT inputs $A_{1-z}$, $B_{1-z}$, ..., $X_{1-z}$ and/or $Data_{1-z}$. It should be noted that the underlying concept of the exemplary embodiment(s) of the present invention would not change if one or more blocks (circuit or elements) were added to or removed from diagram 300.

In one aspect, embedded signature registers 320-322, also known as signature registers, signature latches, or signature flip-flops, are used to facilitate generating a product related signature capable of identifying authenticity of the device. Embedded signature registers 320-322, for example, store a set of fixed value or signature information generated by the signature generator. The stored fixed value is subsequently retrieved during a bitstream readback process. In one embodiment, embedded signature registers 320-322 are hidden from users or customers.

Register 326-328 are a set of registers corresponds to various LUTs such as LUTs 316-318. A function of register 326-328 is to latch outputs generated by LUTs 316-318 before the clock cycle ends. Depending on the applications, register 326-328 are used for data integrity.

A function of LUT is basically a truth table which generates an output based on a set of inputs such as A1 . . . X1. A truth table, in one example, determines or emulates how a combinational logic should behave. A LUT generally includes a group of logic AND gates and a set of muxes capable of accepting a range of inputs from four (4) to sixty-four (64) inputs.

It should be noted that LUTs, muxes, and registers (or flip-flops) situated inside of an FPGA are essential components or building blocks. Such building blocks create logic functional blocks which provide logical implementations to perform certain user defined functions, such as, but not limited to, mathematical computation, network communication, artificial intelligence, power management, security surveillance, and the like. The registers and/or flip-flops provide storage function capable of storing outputs of LUTs during clock cycles.

Configurable LE 302 includes multiple LUTs 310-318, muxes 330-338, embedded signature registers 320-322, and registers 326-328 wherein embedded signature registers 320-322 store fixed values by a device identifier via bus 308. In one aspect, the device identifier which can be facilitated by a host controller is able to set values in various signature registers such as registers 320-322 for device ID. The device identifier, in one example, is configured to generate a set of fixed values based on bit values of incoming bitstream as well as clock signals. In one example, a random number may be generated in response to income bitstream and clock signals. The random number, in one embodiment, is used to facilitate generating fixed values or signature information.

In one aspect, a portion of LUTs in configurable LE 302 do not have associated registers to latch the output or result because the registers are dedicated to signature registers. For example, LUTs 310-312 do not have corresponding registers or flip-flops because registers 320-322 may be assigned to a set of signature registers. It should be noted that LUTs 310-312 can be any number of LUTs capable of receiving any number of inputs such as $A_{1-m}$ to $X_{1-m}$, respectively. Alternatively, another portion of LUTs such as LUTs 316-318 are configured to have corresponding registers such as register 326-328. LUTs 316-318 can be any number of LUTs capable of receiving any number of inputs such as $A_{1-n}$ to $X_{1-z}$, respectively.

An advantage of using the device ID is that it is able to identify an FPGA manufacture identity or model number based on the detected signature information from the readback bitstream.

Figure 3B:
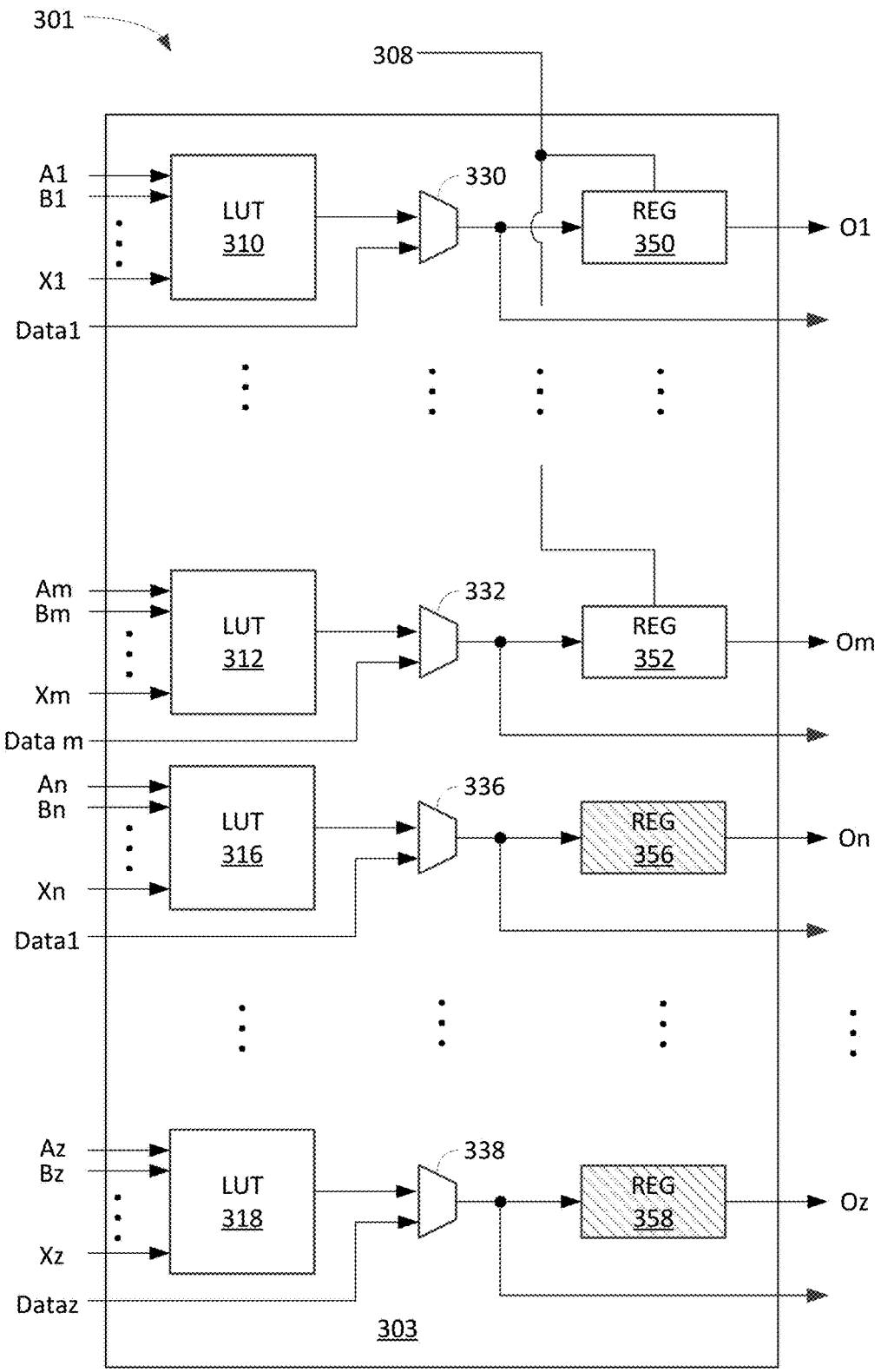

FIG. 3B is a block diagram 301 illustrating CLS 303 in PSD containing embedded signature registers in accordance with one embodiment of the present invention. CLS 303 includes multiple LUTs 310-318, multiplexers ("Muxes") 330-338, embedded signature registers 356-358, and registers 350-352. Muxes 330-338, in one example, are used to select intermediary outputs in response to LUT inputs $A_{1-z}$, $X_{1-z}$, ... $X_{1-z}$ and/or $Data_{1-z}$. Diagram 301 is similar to diagram 300 (shown in FIG. 3A) except that embedded signature registers 356-358 in diagram 301 are situated in different physical locations than embedded signature registers 320-322 in diagram 300. It should be noted that the underlying concept of the exemplary embodiment(s) of the present invention would not change if one or more blocks (circuit or elements) were added to or removed from diagram 301.

Embedded signature registers 356-358, also known as signature registers, signature latches, or signature flip-flops, are used to identify authenticity of the device in use. Embedded signature registers 356-358, for example, store a set of fixed value or signature information generated by the signature generator. The stored fixed value is subsequently retrieved during a bitstream readback process. In one embodiment, embedded signature registers 356-358 are hidden from users or customers. It should be noted that the physical locations for housing embedded signature registers within CLS 303 can be anywhere. For example, the physical locations for housing embedded signature registers can be at the top portion of CLS 303, middle portion of CLS 303, bottom portion of CLS 303, or random with shuffling order between embedded signature registers and registers.

Register 350-352 are a set of registers corresponds to various LUTs such as LUTs 316-318. A function of register 350-352 is to latch outputs generated by LUTs 316-318 before the clock cycle ends. Depending on the applications, register 350-352 are used for data integrity.

An advantage of allowing flexible allocation of embedded signature registers within CLS is that it enhances efficiency of resource allocation based on the applications.

Figure 4:
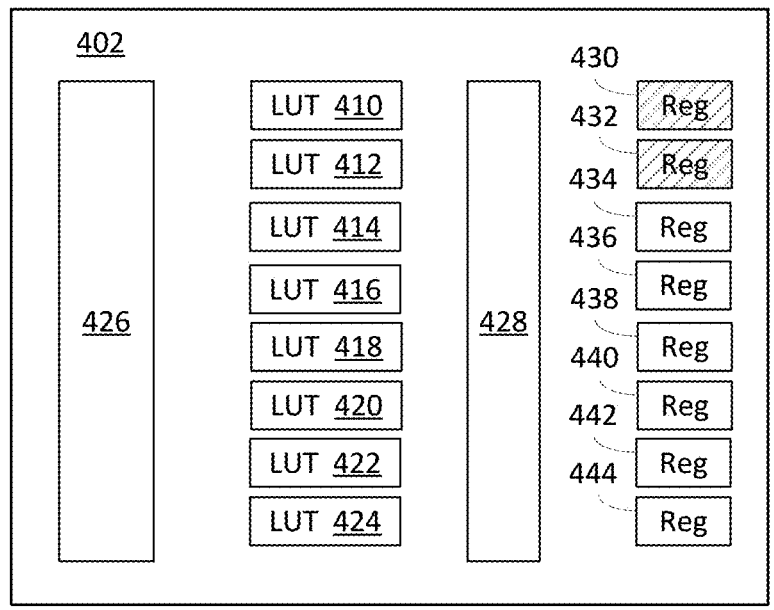
FIG. 4 shows block diagrams illustrating a configurable LE, or logic array block containing signature registers in accordance with one embodiment of the present invention.
Figure 4:
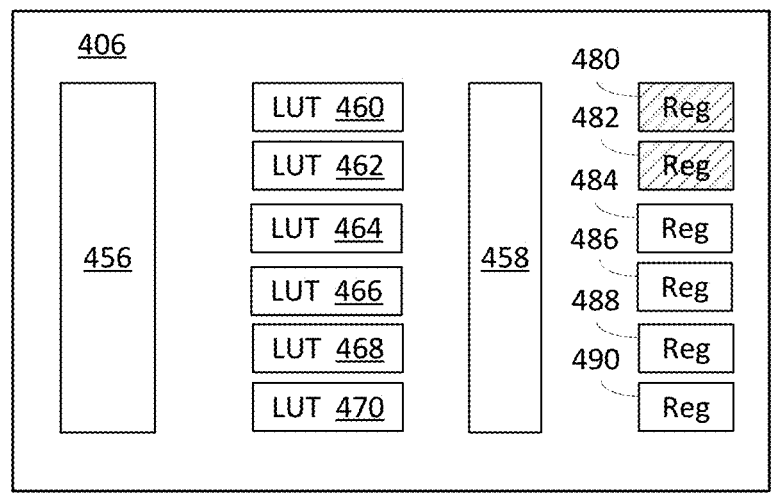

FIG. 4 is a block diagram 400 illustrating configurable LE, CLS, or logic array block 402-406 containing signature registers in accordance with one embodiment of the present invention. Configurable LE 402, in one embodiment, includes configurable routing unit or PIA 426, eight (8) LUTs 410-424, programmable multiplexing array ("PMA") 428, and registers 430-444. In one embodiment, registers 430-432 are designated or assigned as embedded signature registers whereby they are hidden from the end users. It should be noted that the underlying concept of the exemplary embodiment(s) of the present invention would not change if one or more blocks (circuit or elements) were added to or removed from diagram 400.

Configurable LE 406, in one embodiment, includes configurable routing unit or PIA 456, six (6) LUTs 460-470, PMA 458, and registers 480-490. In one embodiment, registers 480-482 are designated or assigned as embedded signature registers whereby they are hidden from the end users. While registers 480-482 are used for handling signature information, LUTs 460-462 do not have corresponding registers.

In one embodiment, PSD includes configurable LBs, an array of routing connections, and a configuration memory for performing programmed logic functions based on user's bitstream. Each of the configurable LBs, for example, includes one or more configurable LEs wherein each configurable LE includes multiple LUTs and registers. The LUTs, in one example, are configured to generate one or more output signals in accordance with a set of input signals.

The registers coupled to LUTs are arranged so that one register corresponds to one LUT. In one example, a first register such as register 430 which corresponds to a first LUT such as LUT 410 is designated for storing a fixed value for facilitating device ID. A second register such as register 432 which corresponds to a second LUT such as LUT 414 is configured to store a second output signal generated by the second LUT such as LUT 414. The fixed value, for example, is read during a bitstream readback process to verify the device identity.

A third register such as signature register 434 which corresponds to a third LUT such as LUT 412, in one embodiment, is designated as an embedded signature register for facilitating device identification. A fourth register such as register 436 which corresponds to a fourth LUT such as LUT 416 is configured to store a fourth output signal generated by the fourth LUT such as LUT 416. Alternatively, the third register such as signature register 434 which corresponds to the third LUT such as LUT 412 is designated to store signature information for facilitating device identification. In addition, a fourth register such as register 436 which corresponds to a fourth LUT such as LUT 416 is designated for storing signature information for facilitating device identification.

In one aspect, a fifth register such as register 438 which corresponds to a fifth LUT such as LUT 418 stores a fifth output signal generated by the fifth LUT, and a sixth register such as register 440 which corresponds to a sixth LUT such as LUT 420 stores a sixth output signal generated by the sixth LUT. A seventh register such as register 442 which corresponds to a seventh LUT such as LUT 422 stores a seventh output signal generated by the seventh LUT, and an eighth register such as register 444 which corresponds to an eighth LUT such as LUT 424 stores an eighth output signal generated by the eighth LUT. In one example, multiple multiplexers in PMA 428 are used to provide internal routing between LUTs 410-424 and registers 430-444.

Depending on the applications, the number of embedded signature registers to be allocated within PSD or FPGA can be programmed by the manufacture. For example, a selected configurable LB may include at least two embedded signature registers.

Figure 5:
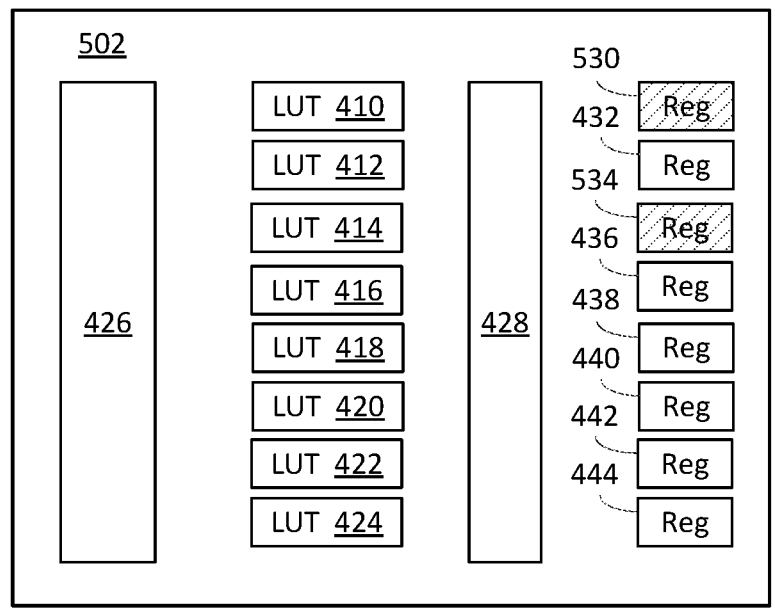
FIG. 5 is a block diagram illustrating configurable LE, CLS, or logic array block containing signature registers in accordance with one embodiment of the present invention.
Figure 5:
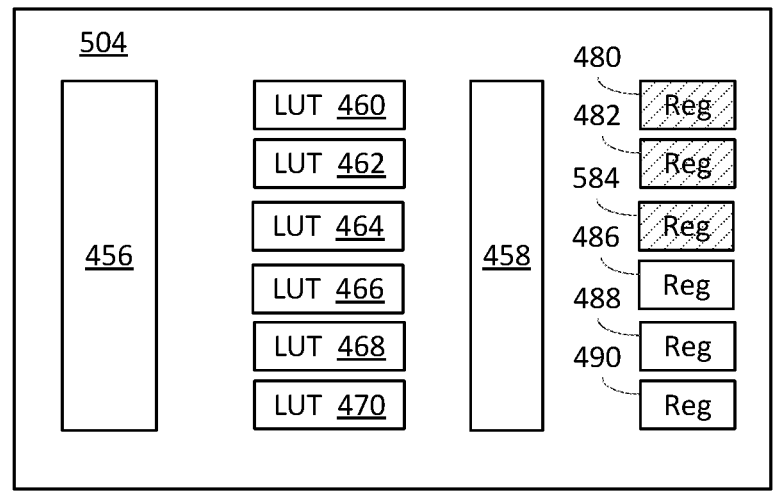

FIG. 5 is a block diagram 500 illustrating configurable LE, CLS, or logic array block 502-504 containing signature registers in accordance with one embodiment of the present invention. Configurable LE 502 is similar to configurable LE 402 except that the physical locations of embedded signature registers are different. Configurable LE 502, in one embodiment, includes configurable routing unit or PIA 426, eight (8) LUTs 410-424, PMA 428, and registers 432-444 530-534. In one embodiment, register 530 and register 534 are designated or assigned as embedded signature registers whereby they are hidden from end users. It should be noted that the underlying concept of the exemplary embodiment(s) of the present invention would not change if one or more blocks (circuit or elements) were added to or removed from diagram 500.

Configurable LE 504, in one embodiment, includes configurable routing unit or PIA 456, six (6) LUTs 460-470, PMA 458, and registers 480-490 and 584. In one embodiment, registers 480-482 and register 584 are designated or assigned as embedded signature registers whereby they are hidden from end users. While registers 480-482 and register 584 are used for handling signature information, LUTs 460-464 do not have corresponding registers.

Based on the applications, the manufacture is able to selectively program total number of embedded signature registers and location of the embedded signature registers to fabricated FPGA devices before shipping them to the end users. A benefit of having the ability to flexibly allocating required signature registers is that it enhances efficiency of resource allocation. For example, for some applications, dedicating a set of signature registers may not be required whereby a total number of zero embedded signature registers may be allocated or programmed.

Figure 6A:
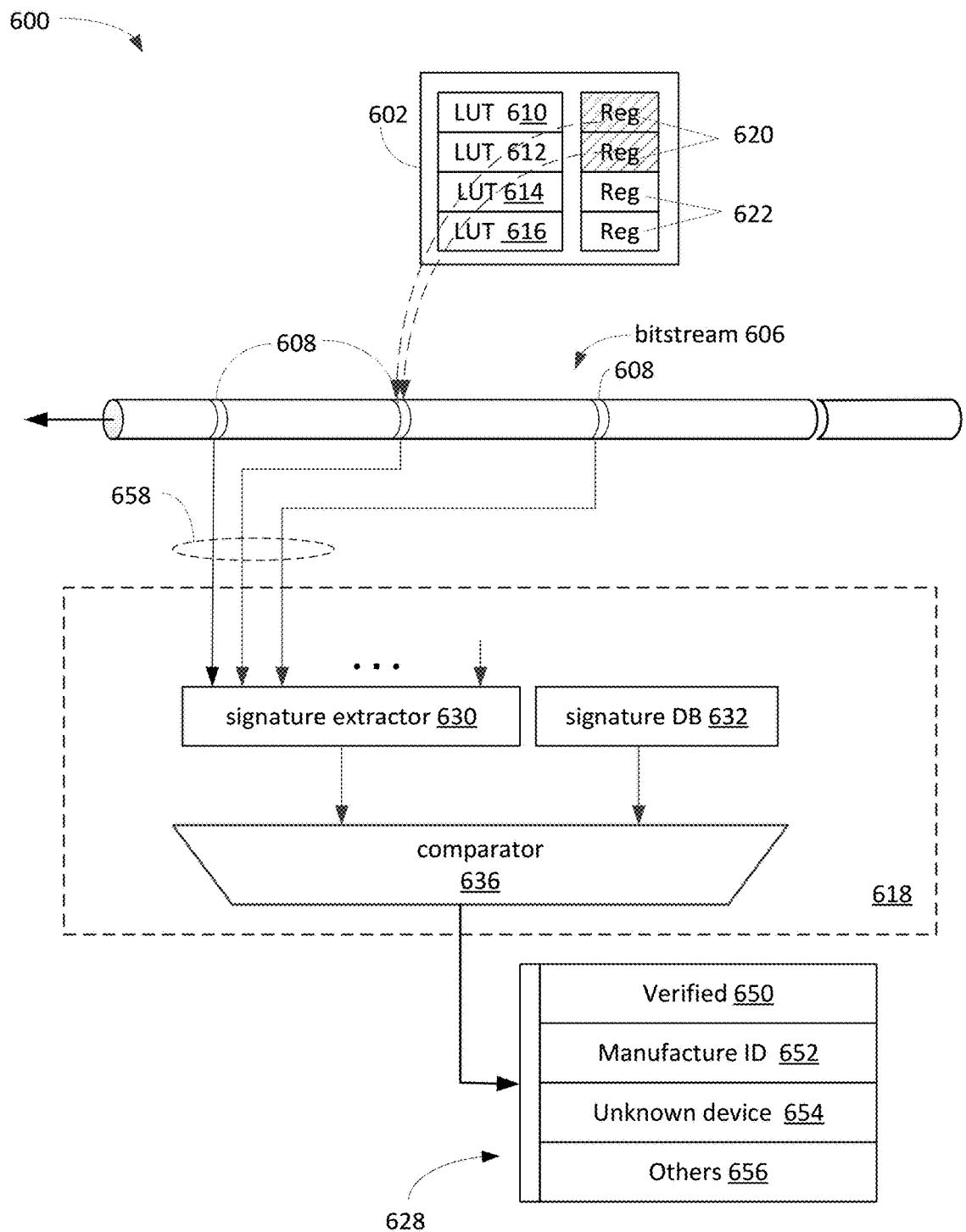
FIGS. 6A-6B are block diagrams illustrating a process of identifying device ID in accordance with one embodiment of the present invention.

FIG. 6A is a logic block diagram 600 illustrating a process of identifying device ID in accordance with one embodiment of the present invention. Diagram 600 includes an exemplary configurable LE 602, readback bitstream 606, device ID component 618, and predefined device identity ("PDI") block 628. Configurable LE 602, in one example, contains four (4) LUTs 610-616 with two (2) embedded signature registers 620 and two (2) regular registers 622. It should be noted that the underlying concept of the exemplary embodiment(s) of the present invention would not change if one or more blocks (circuit or elements) were added to or removed from diagram 600.

Bitstream 606, in one aspect, is a readback bitstream initiated by a manufacture-based host for the purpose of verifying the device or PSD in use. Upon initiating a bitstream readback command, PSD or FPGA, in conjunction with a host controller if any, begins to generate a readback bitstream or bitstream 606. In one embodiment, bitstream 606 includes signature information or fixed value 608 in predefined physical bit locations. The signature information or fixed value 608 are retrieved from embedded signature registers across various configurable LBs in PSD. For example, bitstream 606 contains signature information or fixed value retrieved from embedded signature registers 620. It should be noted that although signature registers 620 correspond to LUTs 610-612 or physically situated in the vicinity of LUTs 610-612, LUTs 610-612 are configured without registers or flipflops in current configuration.

Device ID component 618, in one embodiment, includes a signature extractor block 630, signature database 632, and comparator 636. It should be noted that additional components may be added, such as, but not limited to, random number decoder, signature-bit location allocator, clock component, and the like. In operation, signature extractor 630 retrieves or extracts signature information or fixed value from various physical locations of bitstream 606 as indicated by numeral 658. Comparator 636 compares the extracted value from signature extractor 630 with predefined or preloaded signatures from signature DB (database) 632 and generates a comparison result. The predefined or preloaded signatures are manufacture signatures used to identify device ID or chip manufacture. For example, a predefined signature represented by a sequence of numbers is referred to GW1NZ serial manufactured by GOWIN Semiconductor™. The comparison result is subsequently used to reference PDI block 628.

PDI block 628, in one embodiment, includes verified subblock 650, manufacture ID subblock 652, unknown device subblock 654, and/or others 656. Verified subblock 650 provides information to verify whether the PSD or FPGA device in use is authentic or manufactured by a verified company(s). Manufacture ID subblock 652 is used to report the origin of the manufacture producing PSD based on the comparison result. Unknown device 654 is used to report a finding of counterfeit device based on the comparison result. Depending on the applications, others 656, in one embodiment, can be used to verify the identify of end user based on the comparison result. It should be noted that different applications, different reports may be generated in response to the comparison result.

During an operation, a process capable of determining identity of PLD via a set of designated registers such as embedded signature registers 620 situated across multiple LBs includes receiving a verification bitstream returned from a PLD reflecting signature information and currently programmed information in the PLD. The verification bitstream, for example, is referred to readback bitstream 606. After identifying signature bit locations associated with a set of hidden signature registers embedded in the verification bitstream such as location 608, various fixed ID values are extracted from the signature bit locations 608 associated with the set of signature registers. The fixed ID values are subsequently compared with a predefined PLD ID values to identify authenticity of the PLD. Depending the applications, the fixed ID values is decrypted in accordance with a host defined time stamp. For example, the fixed ID values is decrypted in response to a random value generated in accordance with initial input bitstream and system clock.

An advantage of using the device ID module, which can be software, hardware, or a combination of software and hardware, is to authenticate device as well as identify device specification.

Figure 6B:
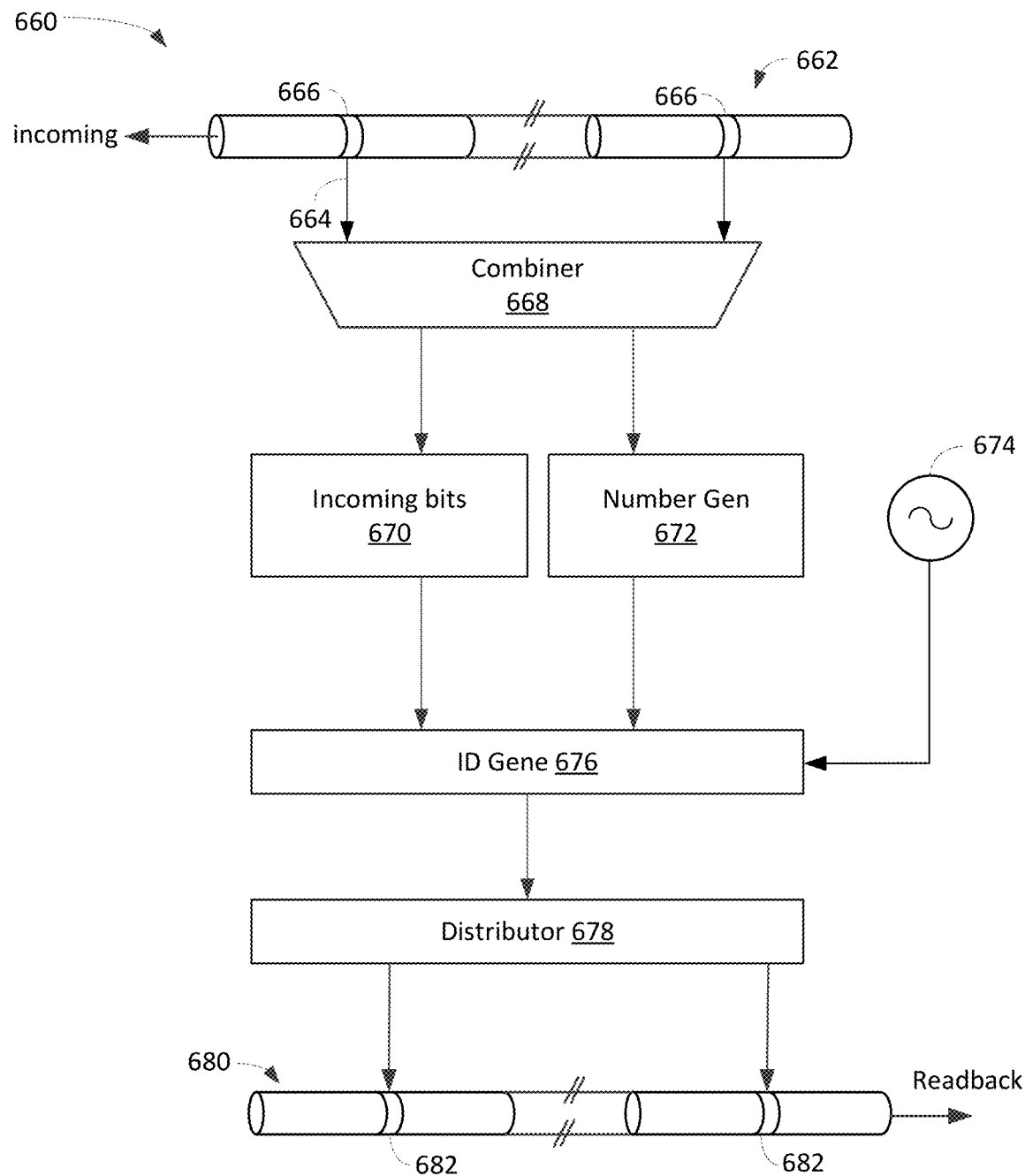

FIG. 6B is a logic block diagram 660 illustrating a process of generating fixed value or signature for identifying device ID in accordance with one embodiment of the present invention. Diagram 660 illustrates an exemplary process of generating a readback bitstream 680 based on incoming bitstream 662. Upon arrival of incoming bitstream 662 at PSD, pre-signature bit information 666 which is located at specific physical bit locations within incoming bitstream 662, is extracted from bitstream 662 as indicated by numeral 664. Combiner 668 combines or collects pre-signature bit information 666 from incoming bitstream 662 and forwards the combined pre-signature bit information to incoming bits block 670. In one embodiment, pre-signature bit information 666 is also forwarded to number generator 672 for generating a random number based on at least a portion of pre-signature bit information 666. It should be noted that pre-signature bit information 666 are situated at the same physical bit locations as signature information or fixed value.

ID generator 676, in one embodiment, generates a set of signature information retrieved from various embedded signature registers in various configurable LBs in PSD. Alternatively, ID generator 676 is also capable of generating signature information in response to random numbers generated by number generator 672 and system clocks 674. Number generator 672, in one aspect, is employed to reduce unauthorized data tampering by generating a random number based on at least a portion of the pre-signature bit information. Upon generating of the signature information, distributor 678, in one embodiment, distributes a sequence of bits representing the signature information to bit locations 682 of readback bitstream 680. Readback bitstream 680 is subsequently forwarded to a manufacture-based host to determine the authenticity of PSD or FPGA in use. It should be noted that the underlying concept of the exemplary embodiment(s) of the present invention would not change if one or more blocks (circuit or elements) were added to or removed from diagram 660.

Figure 7:
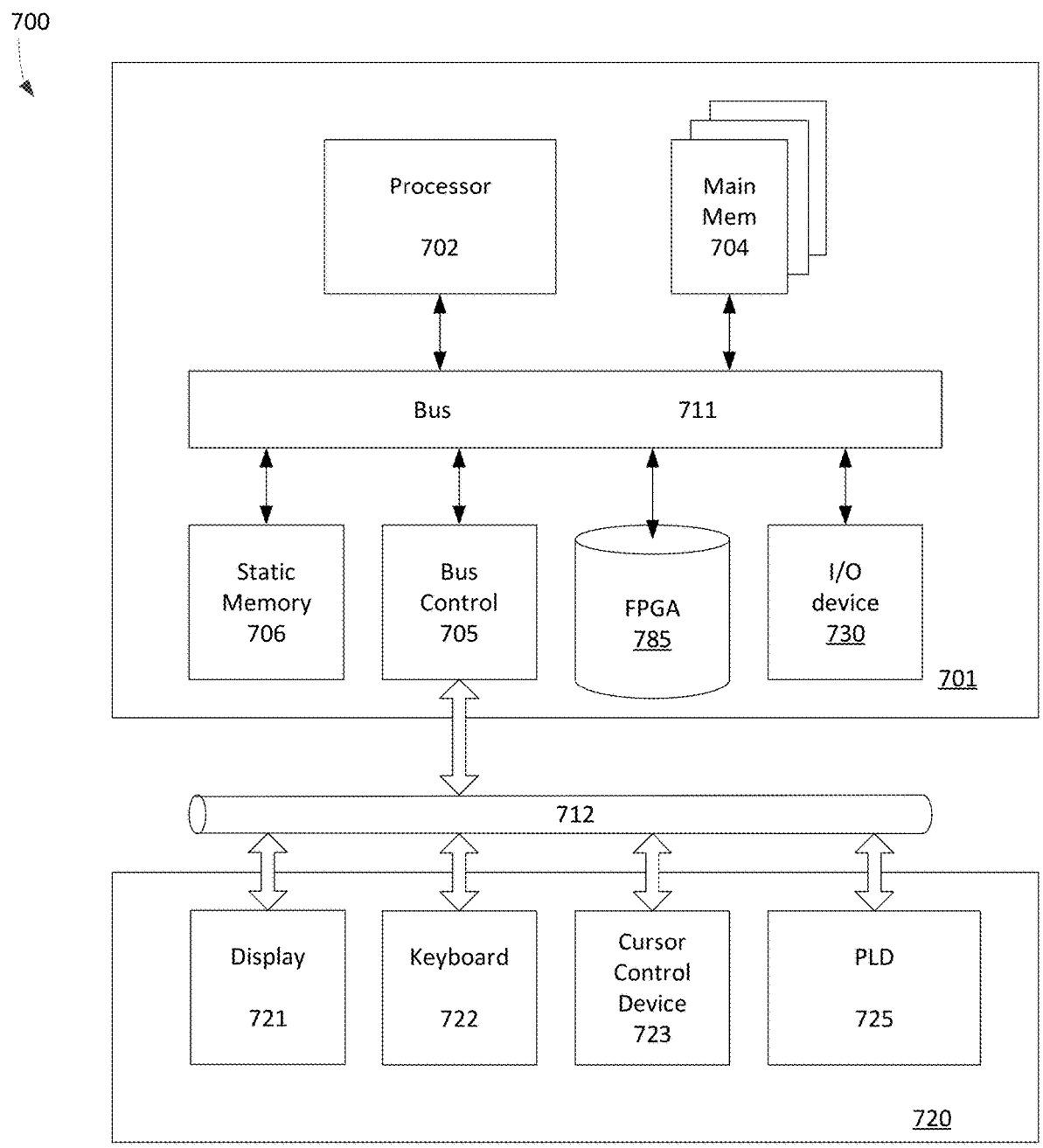
FIG. 7 is a diagram illustrating a system or computer using one or more PSD containing a set of signature registers in accordance with one embodiment of the present invention.

FIG. 7 is a diagram 700 illustrating a system or computer using one or more PSD containing a set of signature registers in accordance with one embodiment of the present invention. Computer system 700 includes a processing unit 701, an interface bus 712, and an input/output ("IO") unit 720. Processing unit 701 includes a processor 702, main memory 704, system bus 711, static memory device 706, bus control unit 705, I/O element 730, and FPGA 785. It should be noted that the underlying concept of the exemplary embodiment(s) of the present invention would not change if one or more blocks (circuit or elements) were added to or removed from FIG. 7.

Bus 711 is used to transmit information between various components and processor 702 for data processing. Processor 702 may be any of a wide variety of general-purpose processors, embedded processors, or microprocessors such as ARM® embedded processors, Intel® Core™ Duo, Core™ Quad, Xeon®, Pentium™ microprocessor, Motorola™ 68040, AMD® family processors, or Power PC™ microprocessor.

Main memory 704, which may include multiple levels of cache memories, stores frequently used data and instructions. Main memory 704 may be RAM (random access memory), MRAM (magnetic RAM), or flash memory. Static memory 706 may be a ROM (read-only memory), which is coupled to bus 711, for storing static information and/or instructions. Bus control unit 705 is coupled to buses 711-712 and controls which component, such as main memory 704 or processor 702, can use the bus. Bus control unit 705 manages the communications between bus 711 and bus 712. Mass storage memory or SSD which may be a magnetic disk, an optical disk, hard disk drive, floppy disk, CD-ROM, and/or flash memories are used for storing large amounts of data.

I/O unit 720, in one embodiment, includes a display 721, keyboard 722, cursor control device 723, and low-power PLD 725. Display device 721 may be a liquid crystal device, cathode ray tube ("CRT"), touch-screen display, or other suitable display device. Display 721 projects or displays images of a graphical planning board. Keyboard 722 may be a conventional alphanumeric input device for communicating information between computer system 700 and computer operator(s). Another type of user input device is cursor control device 723, such as a conventional mouse, touch mouse, trackball, or other type of cursor for communicating information between system 700 and user(s).

PLD 725 is coupled to bus 712 for providing configurable logic functions to local as well as remote computers or servers through wide-area network. PLD 725 and/or FPGA 785 includes one or more device ID modules for verifying device authenticity. In one example, PLD 725 may be used in a modem or a network interface device for facilitating communication between computer 700 and the network.

Computer system 700 may be coupled to a number of servers via a network infrastructure as illustrated in the following discussion.

Figure 8:
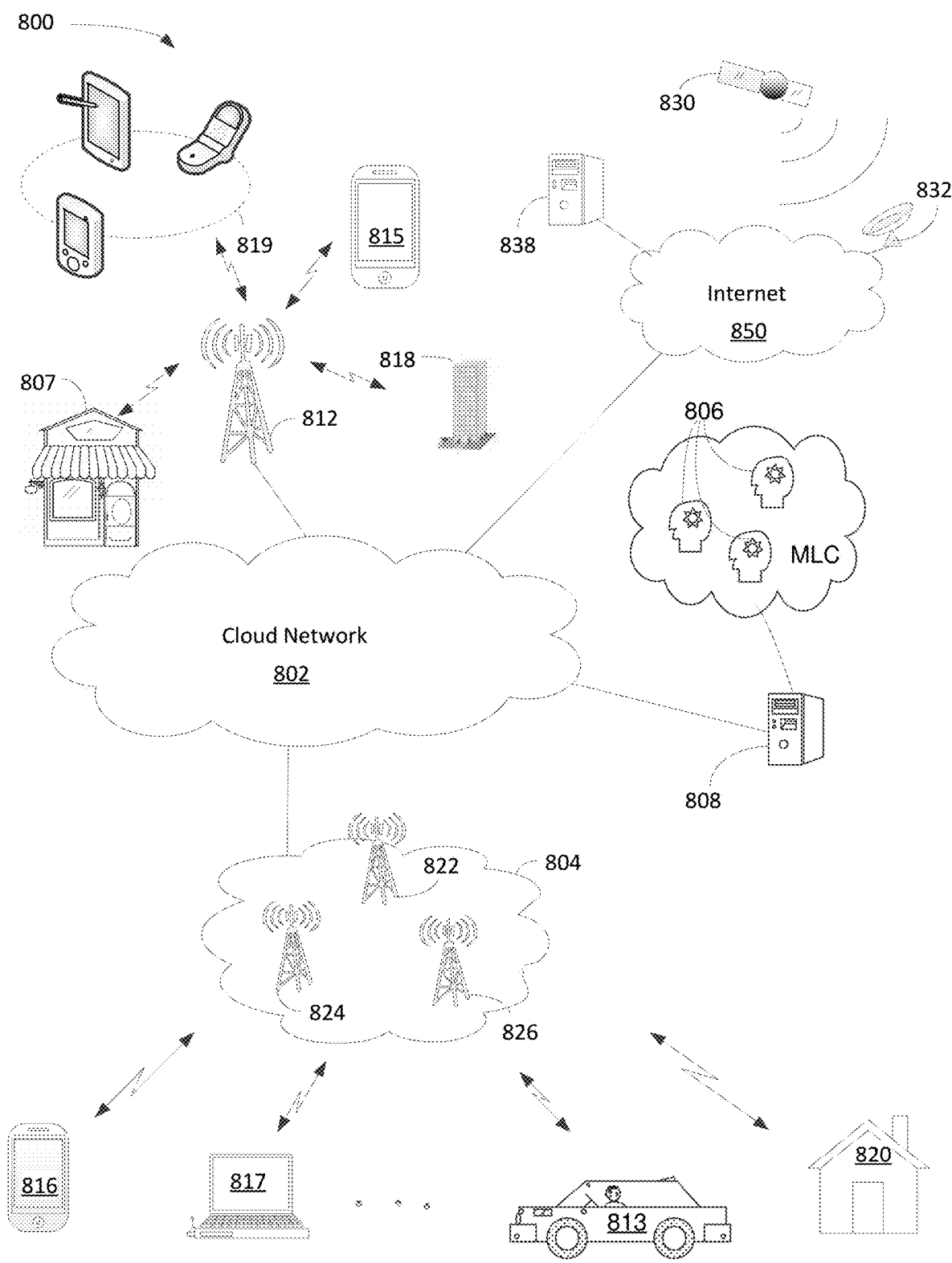
FIG. 8 is a block diagram illustrating various applications of PSD containing signature registers used in a cloud-based environment in accordance with one embodiment of the present invention.

FIG. 8 is a block diagram 800 illustrating various applications of PSD containing signature registers capable of identifying FPGA's device identity which can be used in a cloud-based environment in accordance with one embodiment of the present invention. Diagram 800 illustrates AI server 808, communication network 802, switching network 804, Internet 850, and portable electric devices 813-819. In one aspect, PSD having device ID capability are used in AI server, portable electric devices, and/or switching network. Network or cloud network 802 can be wide area network, metropolitan area network ("MAN"), local area network ("LAN"), satellite/terrestrial network, or a combination of wide area network, MAN, and LAN. It should be noted that the underlying concept of the exemplary embodiment(s) of the present invention would not change if one or more blocks (or networks) were added to or removed from diagram 800.

Network 802 includes multiple network nodes, not shown in FIG. 8, wherein each node may include mobility management entity ("MME"), radio network controller ("RNC"), serving gateway ("S-GW"), packet data network gateway ("P-GW"), or Home Agent to provide various network functions. Network 802 is coupled to Internet 850, AI server 808, base station 812, and switching network 804. Server 808, in one embodiment, includes machine learning computers ("MLC") 806.

Switching network 804, which can be referred to as packet core network, includes cell sites 822-826 capable of providing radio access communication, such as 3G ($3^{rd}$ generation), 4G, or 5G cellular networks. Switching network 804, in one example, includes IP and/or Multiprotocol Label Switching ("MPLS") based network capable of operating at a layer of Open Systems Interconnection Basic Reference Model ("OSI model") for information transfer between clients and network servers. In one embodiment, switching network 804 is logically coupling multiple users and/or mobiles 816-820 across a geographic area via cellular and/or wireless networks. It should be noted that the geographic area may refer to a campus, city, metropolitan area, country, continent, or the like.

Base station 812, also known as cell site, node B, or eNodeB, includes a radio tower capable of coupling to various user equipments ("UEs") and/or electrical user equipments ("EUEs"). The term UEs and EUEs are referring to the similar portable devices and they can be used interchangeably. For example, UEs or PEDs can be cellular phone 815, laptop computer 817, iPhone® 816, tablets and/or iPad® 819 via wireless communications. Handheld device can also be a smartphone, such as iPhone®, BlackBerry®, Android®, and so on. Base station 812, in one example, facilitates network communication between mobile devices such as portable handheld device 813-819 via wired and wireless communications networks. It should be noted that base station 812 may include additional radio towers as well as other land switching circuitry.

Internet 850 is a computing network using Transmission Control Protocol/Internet Protocol ("TCP/IP") to provide linkage between geographically separated devices for communication. Internet 850, in one example, couples to supplier server 838 and satellite network 830 via satellite receiver 832. Satellite network 830, in one example, can provide many functions as wireless communication as well as global positioning system ("GPS"). It should be noted that WAP can be applied a lot of fields, such as, but not limited to, smartphones 813-819, satellite network 830, automobiles 813, AI server 808, business 807, and homes 820.

The exemplary embodiment of the present invention includes various processing steps, which will be described below. The steps of the embodiment may be embodied in machine or computer executable instructions. The instructions can be used to cause a general purpose or special purpose system, which is programmed with the instructions, to perform the steps of the exemplary embodiment of the present invention. Alternatively, the steps of the exemplary embodiment of the present invention may be performed by specific hardware components that contain hard-wired logic for performing the steps, or by any combination of programmed computer components and custom hardware components.

Figure 9:
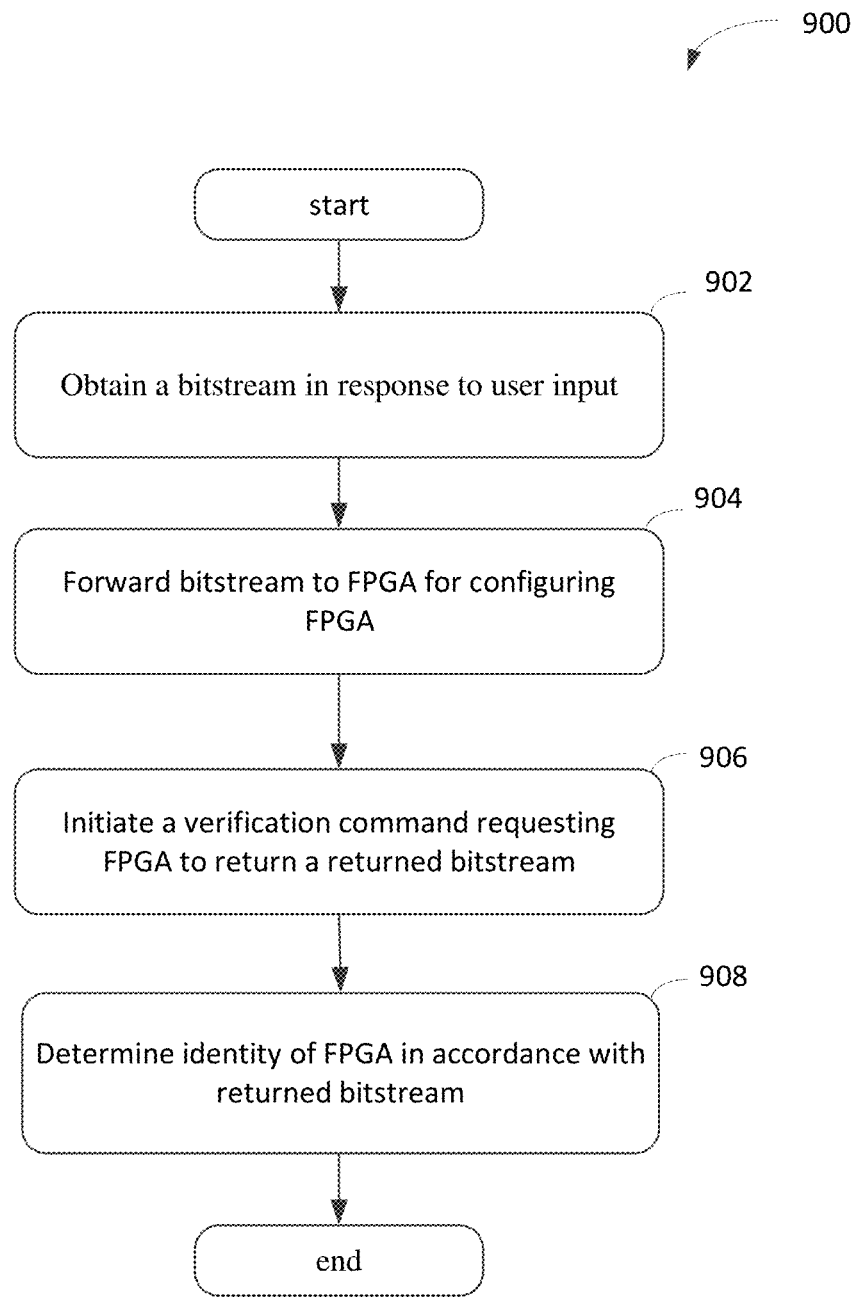
FIG. 9 is a flowchart illustrating a process of determining device ID in accordance with one embodiment of the present invention.

FIG. 9 is a flowchart 900 illustrating a process of identifying device ID in accordance with one embodiment of the present invention. At block 902, the process, capable of verifying identity of FPGA in use via a set of designated registers across multiple configurable LBs, includes obtaining a first bitstream. The first bitstream is based on user defined logic.

At block 904, the first bitstream is forwarded to an FPGA for configuring FPGA. For example, the first bitstream is transmitted from a host to a system containing the FPGA via a communication network.

At block 906, a verification command is initiated to FPGA requesting the FPGA to return a second or readback bitstream reflecting current configuration information of FPGA which includes a set of fixed ID values or signature information fetched from a set of signature registers. The signature registers, in one aspect, are situated in various configurable LBs and/or configurable LEs. In one example, stored values, signature information, or fixed values are read from signature registers in various configurable LEs or configurable LBs. In one example, predefined values or fixed values are stored as well as retrieved from various signature registers in various configurable LEs. It should be noted that at least some of the signature registers are hidden from the user for logic configuration.

At block 908, the process is capable of determining or verifying the identity of an FPGA in use in accordance with a set of fixed ID values or signature information extracted from the second or readback bitstream after comparison between the first bitstream and the second bitstream. For example, FPGA or PSD may be identified as a counterfeit device in response to mismatch between a predefined FPGA signature and a signature embedded in the second bitstream. The process can also determine which manufacture that produces FPGA as well as device model in response to comparison between a predefined FPGA signature and a signature embedded in the readback bitstream.

While particular embodiments of the present invention have been shown and described, it will be obvious to those of ordinary skills in the art that based upon the teachings herein, changes and modifications may be made without departing from this exemplary embodiment(s) of the present invention and its broader aspects. Therefore, the appended claims are intended to encompass within their scope all such changes and modifications as are within the true spirit and scope of this exemplary embodiment(s) of the present invention.

What is claimed is:

1. A programmable integrated circuit ("PIC") device containing configurable logic blocks ("LBs"), an array of routing connections, and a configuration memory for performing programmed logic functions, each of the configurable LBs comprising:
- a plurality of lookup tables ("LUTs") configured to generate one or more output signals in accordance with a set of input signals; and
- a plurality of registers coupled to the plurality of LUTs and arranged so that one of the plurality of registers corresponding to one of the plurality of LUTs, wherein a first register of the plurality of registers corresponding to a first LUT of the plurality of LUTs is designated for storing a fixed value for facilitating device identification, wherein a second register of the plurality of registers corresponding to a second LUT of the plurality of LUTs is configured to store a second output signal generated by the second LUT, wherein the fixed value is read during a bitstream readback process to verify device identity.

2. The device of claim 1, wherein a third register of the plurality of registers corresponding to a third LUT of the plurality of LUTs is designated for storing a fixed value for facilitating device identification.

3. The device of claim 2, wherein a fourth register of the plurality of registers corresponding to a fourth LUT of the plurality of LUTs is configured to store a fourth output signal generated by the fourth LUT.

4. The device of claim 3,
- wherein a fifth register of the plurality of registers corresponding to a fifth LUT of the plurality of LUTs is configured to store a fifth output signal generated by the fifth LUT; and
- wherein a sixth register of the plurality of registers corresponding to a sixth LUT of the plurality of LUTs is configured to store a sixth output signal generated by the sixth LUT.

5. The device of claim 4,
- wherein a seventh register of the plurality of registers corresponding to a seventh LUT of the plurality of LUTs is configured to store a seventh output signal generated by the seventh LUT; and
- wherein an eighth register of the plurality of registers corresponding to an eighth LUT of the plurality of LUTs is configured to store an eighth output signal generated by the eighth LUT.

6. The device of claim 1, wherein the fixed value of the first register of the plurality of registers is forced by a local controller during an IC identification process.

7. The device of claim 1, further comprising a plurality of multiplexers coupled to the plurality of LUTs and configured to provide internal routing between the plurality of LUTs and the plurality of registers.

8. The device of claim 1,
- wherein a third register of the plurality of registers corresponding to a third LUT of the plurality of LUTs is designated for storing signature information for facilitating device identification; and
- wherein a fourth register of the plurality of registers corresponding to a fourth LUT of the plurality of LUTs is designated for storing signature information for facilitating device identification.

9. A system configured to provide various digital processing functions and network communications comprising the device of claim 1.

10. A programmable integrated circuit ("PIC") device containing configurable logic blocks ("LBs"), an array of routing connections, and a configuration memory for performing programmed logic functions, each of the configurable LBs comprising:
- a plurality of lookup tables ("LUTs") configured to generate one or more output signals in accordance with a set of input signals; and
- a plurality of registers coupled to the plurality of LUTs and arranged so that one of the plurality of registers corresponding to one of the plurality of LUTs, wherein a first register of the plurality of registers corresponding to a first LUT of the plurality of LUTs is designated for storing a fixed value for facilitating device identification, wherein a second register of the plurality of registers corresponding to a second LUT of the plurality of LUTs is configured to store a second output signal generated by the second LUT, wherein the fixed value is forced by a local controller during an IC identification process.

11. The device of claim 10, wherein a third register of the plurality of registers corresponding to a third LUT of the plurality of LUTs is designated for storing a fixed value for facilitating device identification.

12. The device of claim 11, wherein a fourth register of the plurality of registers corresponding to a fourth LUT of the plurality of LUTs is configured to store a fourth output signal generated by the fourth LUT.

13. The device of claim 12,
- wherein a fifth register of the plurality of registers corresponding to a fifth LUT of the plurality of LUTs is configured to store a fifth output signal generated by the fifth LUT; and
- wherein a sixth register of the plurality of registers corresponding to a sixth LUT of the plurality of LUTs is configured to store a sixth output signal generated by the sixth LUT.

14. The device of claim 13, wherein a seventh register of the plurality of registers corresponding to a seventh LUT of the plurality of LUTs is configured to store a seventh output signal generated by the seventh LUT.

15. The device of claim 14, wherein an eighth register of the plurality of registers corresponding to an eighth LUT of the plurality of LUTs is configured to store an eighth output signal generated by the eighth LUT.

16. The device of claim 10, wherein the fixed value of the first register of the plurality of registers is read during a bitstream readback process to verify device identity.

17. The device of claim 10, further comprising a plurality of multiplexers coupled to the plurality of LUTs and configured to provide internal routing between the plurality of LUTs and the plurality of registers.

18. The device of claim 10,
- wherein a third register of the plurality of registers corresponding to a third LUT of the plurality of LUTs is designated for storing signature information for facilitating device identification; and
- wherein a fourth register of the plurality of registers corresponding to a fourth LUT of the plurality of LUTs is designated for storing signature information for facilitating device identification.

19. A system configured to provide various digital processing functions and network communications comprising the device of claim 10.

* * * * *